United States Patent
Hundt (10) Patent No.: US 10,117,337 B2
(45) Date of Patent: Oct. 30, 2018

(54) ELECTRICALLY ISOLATED ASSEMBLY AND METHOD FOR THE ELECTRICAL ISOLATION OF AN ASSEMBLY

(71) Applicant: Vacuumschmelze GmbH & Co. KG, Hanau (DE)

(72) Inventor: Harald Hundt, Dieburg (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 0 days.

(21) Appl. No.: 15/880,204

(22) Filed: Jan. 25, 2018

(65) Prior Publication Data
US 2018/0213652 A1    Jul. 26, 2018

(30) Foreign Application Priority Data
Jan. 26, 2017   (DE) .......... 10 2017 201 263

(51) Int. Cl.
| | |
|---|---|
| H05K 1/00 | (2006.01) |
| H05K 1/03 | (2006.01) |
| H05K 1/02 | (2006.01) |
| H05K 3/28 | (2006.01) |
| H05K 1/18 | (2006.01) |

(52) U.S. Cl.
CPC .......... *H05K 3/284* (2013.01); *H05K 1/0213* (2013.01); *H05K 1/181* (2013.01); *H05K 3/282* (2013.01); *H05K 2201/0129* (2013.01); *H05K 2201/0158* (2013.01); *H05K 2201/0175* (2013.01); *H05K 2203/1355* (2013.01); *H05K 2203/1377* (2013.01)

(58) Field of Classification Search
CPC .......... H05K 3/284; H05K 2203/1355; H05K 2203/1377
USPC ........................ 174/256, 258, 259
See application file for complete search history.

(56) References Cited

U.S. PATENT DOCUMENTS

| | | | |
|---|---|---|---|
| 5,354,577 A | 10/1994 | Klingel | |
| 2008/0268166 A1 | 10/2008 | Rickert et al. | |
| 2010/0230138 A1* | 9/2010 | Asahi .......... | H05K 1/0209 174/251 |
| 2013/0154058 A1* | 6/2013 | Boday .......... | H01C 1/14 257/536 |

FOREIGN PATENT DOCUMENTS

| | | |
|---|---|---|
| DE | 2109660 A1 | 9/1972 |
| DE | 2356856 A1 | 5/1974 |
| DE | 4012903 A1 | 10/1991 |
| DE | 102004046744 A1 | 4/2006 |

OTHER PUBLICATIONS

German Office Action for 10 2017 201 263.3 dated Sep. 15, 2017.

* cited by examiner

*Primary Examiner* — Sherman Ng
(74) *Attorney, Agent, or Firm* — Dickinson Wright PLLC (57) ABSTRACT

Electrically isolating an electrical or electronic assembly having a carrier and one or more electrical or electronic components mechanically and electrically connected with the carrier, includes coating the carrier or at least one of the components or both entirely or partially with powder. The powder includes powder particles of electrically isolating material that have an average particle diameter of less than 1000 micrometers.

16 Claims, 4 Drawing Sheets

ELECTRICALLY ISOLATED ASSEMBLY AND METHOD FOR THE ELECTRICAL ISOLATION OF AN ASSEMBLY

This U.S. patent application claims priority to German patent application no. 10 2017 201 263.3, filed Jan. 26, 2017, the entire contents of which is incorporated herein by reference for all purposes.

BACKGROUND

1. Technical Field

The disclosure relates to an electrically isolated assembly and to a method for the electrical isolation of an assembly.

2. Related Art

Electrical and electronic assemblies commonly include electrically isolating carriers such as, for example, circuit boards and substrates, electrical and electronic components, as well as electrically conducting structures that electrically connect the components with each other. The components are electrically connected with the conducting structures and are attached to the carrier by the same or by other means. In the assemblies, metallic contacts such as, for example, pins, SMDs (Surface Mount Devices), solder balls, etc. are used as electrical connections which are electrically and mechanically connected with the conducting structures by means of soldering. Common metallic contacts have, for example, a tin surface or a surface coating made of a more precious metal, such as gold, palladium, silver or the like. Due to the ongoing miniaturization of assemblies, the distance between the contacts has become increasingly smaller, so that today the contacts are often at a distance of only 0.125 mm apart from each other. Because of the fact that metallic particles, or other electrically conductive impurities, may produce unwanted electrical connections and that the danger of such unwanted electrical connections increases as the separating distance decreases, the risk of a malfunction or even the failure of the assembly also increases.

One approach to overcome this drawback consists in cleaning the assembly in order to remove electrically conductive particles that are larger than the smallest separating distance present between the contacts. One disadvantage of this approach, however, lies in the cost and effort that suitable cleaning methods involve and in the fact that such methods do not afford complete security after cleaning as, for example, in the course of further use, new particles may be formed. Another approach consists in partially or entirely covering the assembly after its manufacture by painting or coating it with an isolating material. One disadvantage of this, however, is that the surface of the assembly must be thoroughly prepared before painting or coating, in particular to remove ionic impurities that may be present in the assembly, for example, after a soldering process and which, for example in combination with moisture present in the assembly, can lead to corrosion, electrical migration or similar effects. Assemblies installed in motor vehicles such as, for example, assemblies with control devices, are exposed to climatic conditions that are impossible to control and are therefore particularly susceptible to malfunctions caused by moisture. Assemblies in a motor vehicle may be exposed, for example, to high atmospheric humidity and high temperatures, on the one hand, and then may undergo, in a relatively short period of time, rapid cooling on the other, which leads to condensation forming in the assembly. This will then have significant effects on the electrical isolation of the assembly due to the possible absorption of moisture by its coating and the initiation of an osmosis process.

A need exists to provide an assembly with improved electrical isolation that is also maintained under exposure to moisture. A further object of the invention is to provide a method for the electrical isolation of an assembly.

SUMMARY

An example assembly includes a carrier and one or more electric or electronic components, mechanically and electrically connected with the carrier, wherein the carrier or at least one of the components, or both, is (are) entirely or partially coated with a powder and the powder includes powder particles of electrically isolating material that have an average particle diameter of less than 1000 micrometers.

An example method for electrically isolating an electronic assembly having a carrier and one or more electric or electronic components that are mechanically or electrically connected with the carrier, includes coating the carrier or at least one of the components or both entirely or partially with powder, the powder comprising powder particles of electrically isolating material that have an average particle diameter of less than 1000 micrometers.

Other assemblies, methods, features and advantages will be, or will become, apparent to one with skill in the art upon examination of the following detailed description and appended figures. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF EXAMPLE EMBODIMENTS

In normal climates, when assemblies are exposed to atmospheric stress, this always assumes the form of exposure to humidity, wherein the coating of the assembly abides in a state of equilibrium with the water vapor present in the atmosphere. Since, for example, no polymer is impermeable to water vapor, there is always a given amount of dissolved water in the polymer. As the temperature rises and the air humidity increases, more water can become embedded in the polymer. In such cases, the equilibrium between the water dissolved in the polymer and the pressure of the water vapor in the air is the physically decisive process. At the same time, at a relative humidity of approximately 40%, ultra-thin water films are formed on a molecular scale. At a relative humidity of approximately 60%, a film with a thickness of up to four molecular layers will have formed on the surface. A film of such thickness is already capable of interacting with hygroscopic, that is, water absorbing impurities present on the surface of the film. At a relative humidity of approximately 80%, around ten molecular layers will have formed. These exhibit a behavior that already resembles that of normal water, meaning that dissolution processes begin that involve salts present on the surface and ionic processes take place.

Other conditions are present in the case of condensation. Condensation occurs when the saturation vapor pressure is surpassed at a given temperature. If a cold component is brought into a warm atmosphere, the air directly adjacent to the component will be cooled. Since cold air can absorb less water than warm air, the water condenses and may precipitate in the form of visible drops onto the assembly. This is physically a process that is comparable to that of the meteorological formation of fog. This risk of falling below the dew point is particularly great at low temperatures of between 0° C. and 10° C.

In the case of condensation, some physical laws with respect to high atmospheric humidity change. The water dissolved in the polymer no longer abides in a state of equilibrium with the water vapor in the air, but rather in equilibrium with the water that has condensed on the surface of the component or on that of the paint. The physical laws that now come into effect can be summarized by the term osmosis. Osmosis means that any substance dissolved in water will become increasingly diluted until the point at which the osmotic pressure of the thus forming solution equals that of the water, or that of the drop of water present on the paint film. This affects, for example, salts, such as those found in traces of hand perspiration present on a printed circuit board, but it may also affect the water soluble constituents of soldering fluxes. These osmotic effects drastically reduce levels of electrical resistance and may even result in the formation of bubbles.

The processes summarized by the term osmosis may therefore have an impact both during the preliminary treatment of the circuit board before application of the protective paint, as well as on the coating substance itself. The temperature-humidity exposure under a high level of air humidity of over 90% relative humidity and at a constant temperature does not only result in the formation of condensation. Test commonly conducted on assemblies using so called "condensation water devices" in accordance with standard IEC60 068-2-3 (which corresponds to DIN 50 017) result in the constant formation of condensation and start the osmotic processes described above. This can be further aggravated by a contamination with dirt particles or other harmful substances found in the surrounding air or by contamination with process substances present in the assembly's immediate environment, such as fuels, oils, softening agents or the like commonly found in engine compartments.

Figure 1:
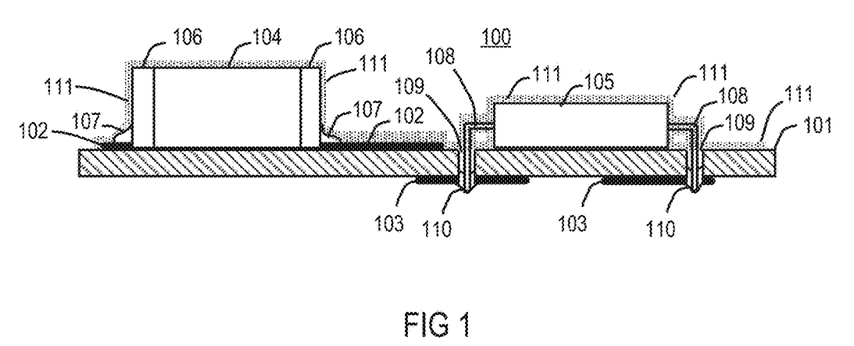
FIG. 1 is a schematic diagram illustrating an assembly with electrical isolation improved by means of electrically isolating powder.

In FIG. 1 an assembly 100 is shown that comprises a plate shaped carrier 101 with two large lateral surfaces running parallel to each other which, for the purpose of distinction, in the following will be designated as upper side and underside. A structured metallization with conducting paths 102 has been applied on the upper side of the carrier and a structured metallization with conducting paths 103 has been applied to the underside of the carrier 101. The carrier 101 is manufactured of electrically isolating material such as, for example, laminated paper, epoxy resins or ceramics. The conducting paths 102 and 103 comprise, for example, copper or aluminum in a predominantly untreated state, or with a special surface coating of, for example, tin, palladium, gold or silver. Such a construction with an electrically isolating carrier and with at least on electrically conductive structure (conducting paths) arranged on and attached to its surface is also known under the name of "printed circuit board" or "substrate".

Electric or electronic components 104, and 105 are mechanically connected with the carrier 101 and electrically connected with the conducting paths 102 and 103. Component 104 has a so called surface-mounted device (SMD) housing of a cuboid shape and has two electric contacts 106 on opposing end sides. The component 104 is applied flatly on the upper side of the carrier 101, so that the end sides that carry the contacts 106 extend vertically from the upper side of the carrier 101. The positions of the contacts 106 correspond in the area of the component 104 to the positions of the conducting paths 102, to which they are soldered with solder, forming a right angle. The component 105 comprises, for example, a tube shaped main body from whose end side connection wires 108 first extend away before bending at a 90° angle and extending on in the direction of the carrier 101. The ends of the connection wires 108 that face the carrier 101 are led to the underside of the carrier 101 via drill holes 109, where they are soldered to the conducting paths 103, forming solder points 110 (or they are otherwise electrically and mechanically connected).

In order to avoid electrical short circuits in the assembly 100 caused by metallic particles, the carrier 101, together with the conducting paths 102, components 104 and 105, contacts 106, connection wires 108 and the solder points 107 are provided with an electrically isolating coating on the upper side. Although, in this example, only the upper side is (entirely) coated, as an alternative or in addition to this the underside may also be entirely or partially coated. As already indicated, the coating both on the upper side and on the underside may not only be applied entirely, but may be applied partially as well. The coating 111 comprises powder with powder particles of electrically isolating material and with an average particle diameter of less than 1000 μm, wherein the average particle diameter may also be smaller than 600 μm, smaller than 500 μm, or even smaller than 100 μm.

In the present case, the coating 111 covers the entire upper side of the assembly, wherein the coating 111 is carried out during a final stage following the complete manufacture of the assembly 100 and an optional final cleaning. In the event that an undesired metallic particle changes its position on the assembly 100 and that the metallic particle accidently comes to rest on two contact points, the coating, by means of its electrically isolating powder particles, prevents the emergence of an electrical contact between the two contact points and thus also prevents the occurrence of a short circuit between these two contact points. In order that the non-conductive particles do not change their position and retain their effectiveness as a selective covering of the exposed metal surfaces, the powder particles are kept very small, allowing the natural adhesive forces on the upper surface of the assembly to exert their effect.

The coating of the assembly or of a part thereof can be carried out by means of various processes. One such possibility consists in applying the powder onto the assembly by stream using a nozzle or by using the nozzle to inject the powder into the area surrounding the assembly. In this manner a coating can be carried out without a great deal of effort, that is, simply and at a reasonable cost. Another method includes introducing powder into the area surrounding the assembly, wherein the powder particles are electrically loaded with a certain polarity and the areas of the assembly that are to be coated are loaded with the opposite polarity, so that they attract the powder particles by means of electrostatic attraction. With this method, a selective covering of individual areas can be realized with little loss of powder. A third exemplary possibility for coating the assembly consists, for example, in covering the assembly or individual parts of the assembly with powder (powder transfer) and subsequently shaking or blowing off the surplus powder. In this manner selected areas can be treated without a great deal of effort.

The powder transfer can, for example, be realized by placing the assembly on a tube shaped container that has a bottom and is filled with powder, specifically on the end of the container that is opposite the bottom, wherein the end of the container opposite the bottom may be provided, for example, with a sealing lip made of rubber. After placing the assembly on the tube shaped container the entire arrangement, consisting of the assembly and the tube shaped container, is, without changing their positions relative to each other, rotated, for example, at 180°. In the process, powder falls onto at least certain areas of the assembly and covers them. After this, the arrangement consisting of assembly and tube shaped container is returned to its original position, meaning that it is either rotated back by 180° or it is rotated further by 180°. The surplus then falls back into the tube shaped container and at least certain areas of the assembly remain covered with the powder particles. This approach can be applied both to only one side of the assembly (upper side or underside), or to both sides (upper side and underside). If the assembly is installed inside of a housing and if it has no particular areas for which the isolating powder is problematic, then the housing can be filled with a defined amount of powder which, if necessary, can be evenly distributed by shaking. If surplus powder, for example, needs to be removed from the housing afterwards, this can be achieved by pouring it out.

Figure 2:
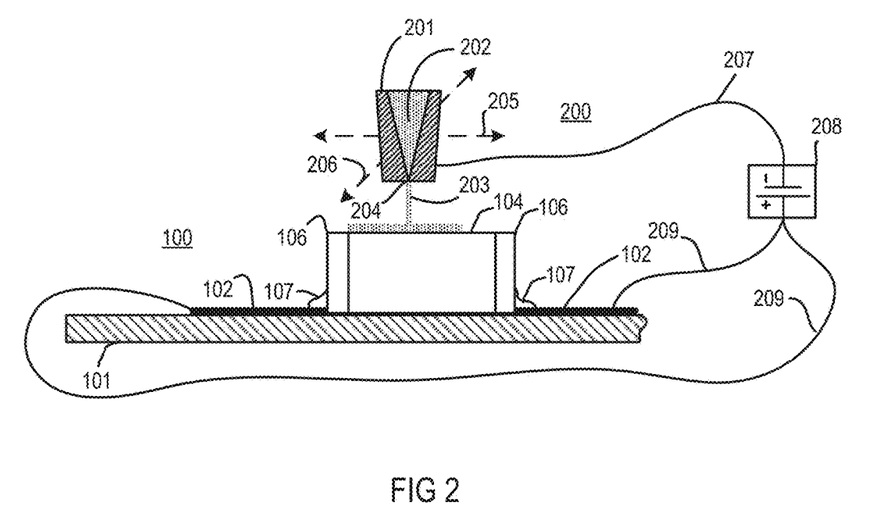
FIG. 2 is a schematic diagram illustrating an arrangement for the electrical isolation of an assembly by means of the spray application of electrically isolating powder.

An exemplary arrangement for the coating of assemblies is shown in FIG. 2. In the shown example, a segment of the assembly 100 shown in FIG. 1, namely the segment with and surrounding the SMD component 106, is to be coated. An arrangement 200 for coating the assembly 100 comprises a nozzle 201 which concentrates the powder 202 into a stream 203 that is directed at the assembly 100. In this case the powder 202 is pressed through a narrowing 204 of the nozzle 201 under pressure, for example, by means of a gas stream. As shown here, the nozzle 201 is movable parallel to the assembly 100, or respectively, parallel to the carrier 101, in one dimension (for example along a direction 205), or in two dimensions (for example along the direction 205 and along a vertically running direction 206). In this manner the powder 202 can be applied to any desired segment of the assembly 100.

The precision with which a desired pattern can be applied to the assembly 100, depends, inter alia, on the thickness or on the expansion of the stream 203, as well as on the distance between the assembly 100 and the nozzle 201. Depending on how far away the nozzle 201 from the assembly 100 is and how broadly the stream 203 fans out toward the assembly, it may be possible to forgo moving the nozzle 201 parallel to the assembly 100. Moving the nozzle 201 can be omitted, for example, when the powder particles are electrically loaded in advance and strike a surface of the assembly 100 that is loaded with the opposite polarity. The nozzle 201, for example, may comprise a conducting material, such as metal, and may be connected to a pole 207 of a voltage source 208, the pole 207 being loaded with a first polarity. A second pole 209 of the voltage source 208 having a polarity that is opposite that of the first polarity is, for example, connected with electrically loadable or conductive surfaces of the assembly 100.

By means of the arrangement shown in FIG. 2, various coating processes can be carried out. Powder 202 can be applied to the desired segment using the nozzle 201 and surplus powder can then either be discharged by, for example, rotating or tilting the assembly 100 or by blowing out the surplus powder using at least one further nozzle or using the nozzle 201, in which case air is pressed through the nozzle 201 following the powder 202. As an alternative, numerous nozzles 201 may be provided for coating (and blowing out), wherein these nozzles can also be arranged in a matrix form and controlled individually, as needed.

Another possibility for operating the arrangement 200 entails the use of electrostatic forces in order to keep the amount of surplus powder to a minimum. For this, as described above, the voltage source 208 is employed in the manner shown in combination with one or more static or moveable nozzles 201. The vast majority of the powder particles that are loaded with the first polarity are in this case electrostatically attracted by the oppositely loaded surfaces of the assembly 101, thus allowing the amount of free moving, that is surplus powder particles to be kept to a minimum.

Figure 3:
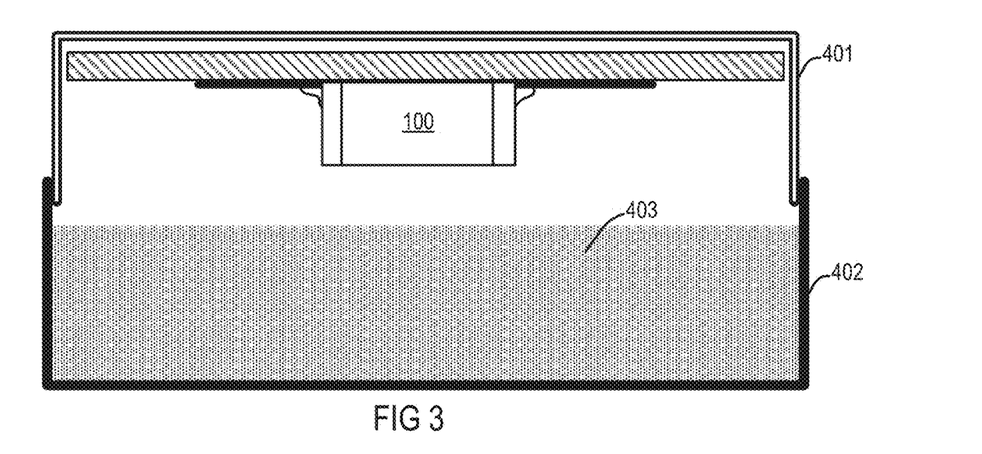
FIG. 3 is a schematic diagram illustrating an arrangement for the electrical isolation of an assembly by applying an electrically isolating powder before coating.

In addition to this, arrangements for the coating of assemblies with powder can also be employed that do not include a nozzle or nozzles. Such an arrangement is shown, for example, in FIG. 3. In the arrangement shown in FIG. 3, the assembly 100 is installed in a half shell 401 which is, for example, part of a housing not further shown here. The half shell 401 has an opening, as well as a bottom arranged opposite of the opening, with the assembly 100 positioned in the vicinity of the bottom. The half shell 401 is placed with its opening facing downward on a tube shaped container such as a cup 402 that has a bottom and an opening positioned opposite of the bottom. For example, it may be inserted to a certain extent into the opening of the cup 402 as shown in FIG. 3, so that the two openings rest against each other. An elastic sealing lip (not shown) may be provided at the transition of the half shell 401 to the cup 402, or the cup 402 may be manufactured from an elastic material such as rubber, thus providing for a sealed transition between the half shell 401 and the cup 402. The cup 402, which is initially positioned underneath the half shell 401, is filled with powder 403.

Figure 4:
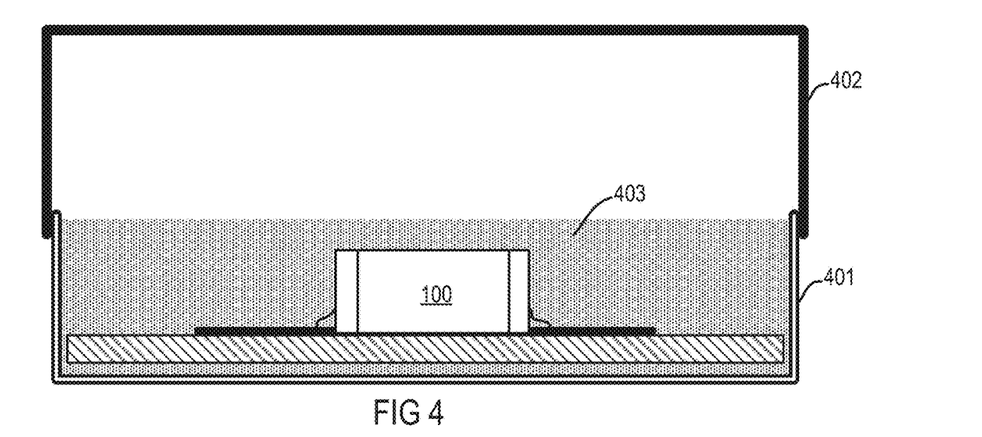
FIG. 4 is a schematic diagram illustrating the assembly in accordance with FIG. 3 during the coating process.

In the following step the entire arrangement, consisting of cup 402, half shell 401 and the assembly 100, is rotated at 180°. The powder then moves downward, meaning that it falls out of the cup 402 and into the half shell 401. In the process, the powder 403 completely (or partially) envelops the assembly 100. The result of this step is shown in FIG. 4.

Figure 5:
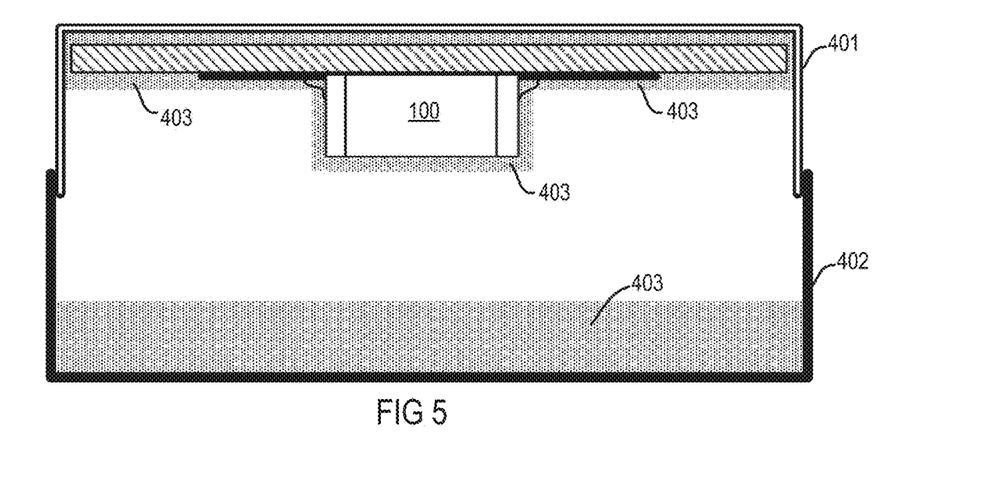
FIG. 5 is a schematic diagram illustrating the assembly in accordance with FIG. 3 after the coating process.

Afterwards, the entire assembly, consisting of cup 402, half shell 401, and assembly 100 is either rotated further by 180° or rotated back by 180°, returning it to its original position (see FIG. 3). In the process, surplus powder 403 falls back into the cup 402 while another portion of the powder 403 remains adhered to the assembly 100. The result of this step is shown in FIG. 5.

If the electronic assembly 100 has already been installed in a completely, or at least mostly, closed housing and the arrangement has no segments for which isolating powder is problematic, then, as an alternative, the mostly closed housing may be filled with a sufficient quantity of powder, which, if necessary, can be evenly distributed by shaking and then, if necessary or desired, discharged. In addition to this, by combining various other measures, described above in connection with alternative coating methods, further possibilities for completely or partially covering assemblies with isolating powder arise.

Depending on the chosen coating method, covering the electric assembly with electrically isolating powder can exhibit a twofold electrically isolating effect. In addition to the coating of, for example, conductive segments of the assembly, undesired metallic particles that were already present in the assembly before the coating was carried out are also covered by the powder and thus obtain a coating of electrically isolating powder. In this manner, in the event that these metallic particles change their position in the assembly and come to rest on an electrically conductive surface of the assembly, the powder particles adhered to them will prevent them from producing an electrical short circuit.

All limitations mentioned further above that exist with regard to known covering coatings and paints are, for the most part, excluded by the coating/covering using electrically isolating particles of a small size. The electrically isolating particles rest loosely on the surface of the assembly and do not form a cohesive layer, so that the circuit board surface is not exposed to any particular stresses, such as those caused by temperature or humidity. Given an appropriate choice of material for the electrically isolating particles, the electrically isolating capacity will also be stable over a longer period of time. Suitable powder materials exhibit at least one of the following properties: no or little absorption of water, good electrically isolating properties, chemically inert, no transfer of ions or formation of ionic impurities, no chemical reaction with soldering flux residues, no chemical reaction with metals or plastics and sufficient temperature resistance. Materials that fulfill, at least to a large extent, this requirement profile, include, for example, non-organic substances that exhibit a low degree of solubility in fluids, but also organic substances such as, for example, thermoplastics and thermosets. The low degree of solubility in fluids such as water, for example, is of importance because this limits the transfer of ions. Suitable powders include, for example, those consisting of ceramic particles, such as calcium carbonate ($CaCO3$), silicon dioxide ($SiO2$), magnesium oxide (MgO), aluminum oxide ($Al2O3$) or compounds of these such as those found, for example, in chalk. The electrically isolating material may exhibit a solubility in water of less than 0.1 grams per liter and/or be resistant to temperatures of at least 200 degrees Celsius.

Suitable synthetic materials for the powder include, for example, at least one of the following technical plastics: polyamide (PA), polycarbonate (PC), polyvinyl chloride (PVC), polymethyl methacrylate (PMMA), acrylonitrile butadiene styrene copolymer (ABS), polybutylene terephthalate (PBTP), polyethylene (PE), polypropylene (PP), polystyrene (PS), styrene acrylonitrile copolymer (SAN), polyethylene terephthalate (PET/PEPT), polytetrafluorethylene (PTFE), polyoxymethylene (POM), polyvinylidene fluoride (PVDF), perfluoralkoxy polymer (PFA), fluorethylene propylene (FEP), tetrafluorethylene perfluor methyl vinyl ether (MFA), ethylene chlorotrifluoro ethylene (ECTFE), polyether ether ketone (PEEK), polyetherimide (PEI), polyether sulfone (PES), polysulfone (PSU) and polyphenylene sulfide (PPS).

Figure 6:
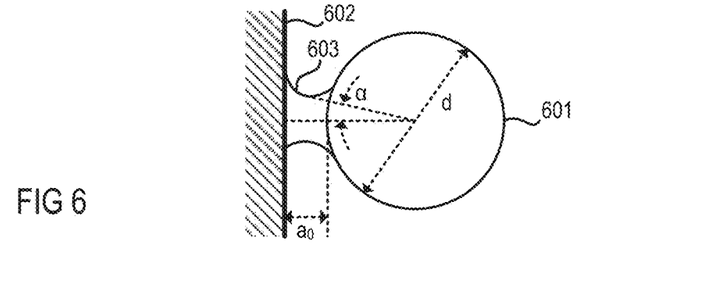
FIG. 6 is a simplified model illustrating the adhesive force that arises between a smooth ball and a smooth, vertically standing wall surface.
Figure 7:
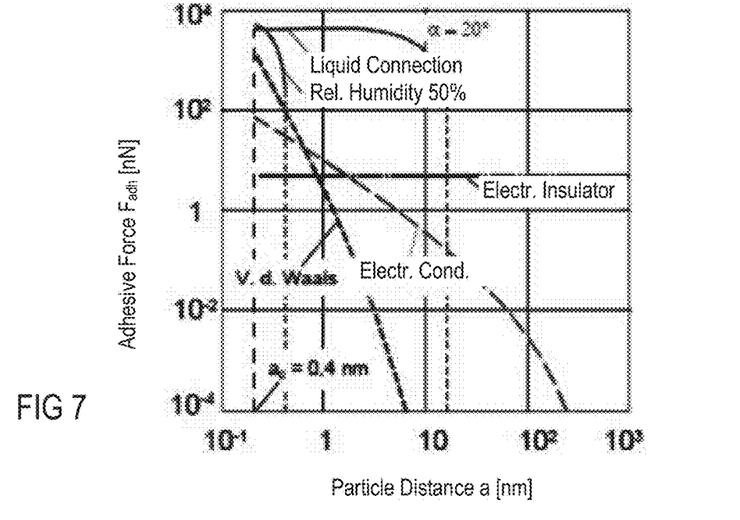
FIG. 7 is a diagram illustrating the dependency of the adhesive force on the distance separating the ball from the wall surface in the model shown in FIG. 6.
Figure 8:
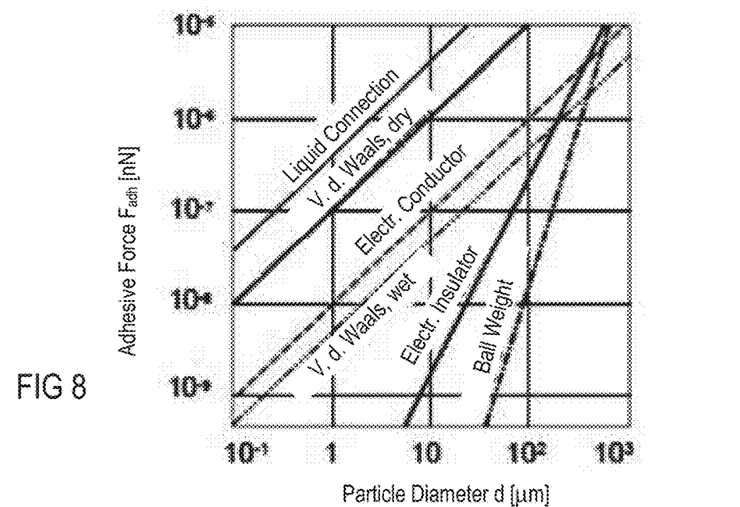
FIG. 8 is a diagram illustrating the dependency of the adhesive force on the diameter of the ball in the model shown in FIG. 6.

Coating with electrically isolating powder includes both applying the powder, as well as attaching the powder particles to suitable surfaces. The adhesive forces that may be employed for this purpose can be divided into three groups. Of these, a first group concerns the surface and field forces that come into play when direct particle contact is given, a second group concerns material bridges between the contact surfaces and a third group includes interlocking connections. The surface and field forces with direct particle contact may themselves be further divided up into Van der Waals Forces, electrostatic forces and magnetic forces. The group of material bridges between the contact surfaces may include organic macromolecules, liquid bridges and solid particle bridges such as those that result from recrystallization, sintering or reactions that take place between two solid materials. Adhesive forces grow as the particle size becomes larger and as the distance separating the particle and the surface increases. FIGS. 6 to 8 illustrate, by means of a simplified model that uses a smooth ball 601 and a vertically standing smooth plate 602 (cf. FIG. 6), the basic interrelations between adhesive forces. A material bridge 603 may also optionally be present between the ball 601 and the plate 602. In this case, the ball 601 is positioned at a distance of $a_0$ from the plate 602. The ball 601 had a diameter d and the taper angle of the material bridge 603 is designated as α.

FIG. 7 shows the interrelation between an adhesive force $F_H$ in nN (nano-Newtons) and the distance a in nm (nanometers) separating particles with regard to various kinds of adhesive force. The dependency of the adhesive force $F_H$ on the size of the particles for the various kinds of adhesive forces is illustrated in FIG. 8.

The adhesive force $F_H$ that affects a powder particle can be calculated with the aid of the so called JKR (Johnson, Kendall, Roberts) Model:

$$F_H = -3\pi \cdot \gamma_s \cdot r$$

In this model, $\gamma_s$ indicates the surface energy and r indicates the radius, meaning the half of the diameter d of the particle. The adhesive force $F_H$ is to be understood as the maximum force at which a separation or detachment of the particle from the surface begins, that is, the adhesive force $F_H$, equally the detachment force $F_A$, is:

$$F_H = F_A = (4/3) \cdot \pi \cdot r3 \cdot a \cdot \rho,$$

wherein ρ is the density of the particle material and a indicates the distance separating the particle from the surface.

In the case of surfaces that do not extent horizontally, the force of any impact that takes place will be increased by the force of gravity. In the extreme case of a vertically standing surface (as shown in FIG. 6), although the powder particles adhere to the surface as a result of the surface forces, they will still be exposed to weight force. This equilibrium is dependent on the material, that is, on its density. Calculations of the force ratios using the simplified ball-plate model show that the weight force only becomes the predominant force when a particle size of a few 100 µm is surpassed, causing the ball to fall from the wall. This means that powder particles that are smaller than a certain size do not detach from a vertically standing surface such as, for example, a wall, if they are not exposed to a strong impact.

In order to demonstrate the adhesive forces that come into play with small powder particles, the following exemplary calculation can be performed: If the adhesive forces and the detachment forces that arise when an impact occurs can be determined for various powder particle sizes, then the break-off point, meaning the theoretical force-free point, that is, the level of force at which the powder particle independently detaches itself, can be calculated. This interrelation is graphically illustrated in FIG. 9 for a plastic particle. In accordance with this simplified calculation and based on the equations given above, powder particles of plastic of a size greater than 133 µm will fall off a surface upon undergoing an impact of approximately 1,500 times the force of gravity, whereas smaller particles will remain adhered.

Figure 9:
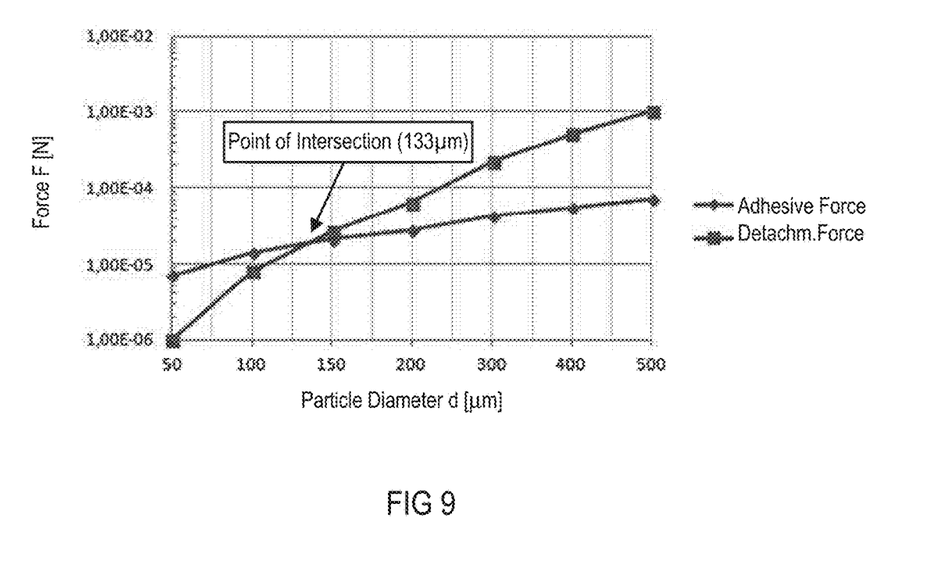
FIG. 9 is a diagram illustrating the interdependency of adhesive force and detachment force in dependency of the diameter of the ball in the model shown in FIG. 6.

In the example shown in FIG. 9, adhesive forces on a ball shaped plastic particle resting on a smooth surface are compared to detachment force from impacts at an acceleration of approximately 1500 g (g=gravitational force). In this example, the point at which the two curves intersect lies somewhere around a particle diameter of 133 µm. This means that particles with a particle diameter of less than 133 µm withstand impacts of up to 1500 N without changing their position. At an acceleration of 1500 g, the corresponding particle size for plastic (in this case polystyrene with a density of 1052 kg/m3 was taken) is 133 µm and smaller, for copper it is 256 µm and smaller, for tin 245 µm and smaller, as well as a particle size of 1000 µm, for example, for silicon dioxide (with a density of 0.738 kg/m3). Simplified this means that particles smaller than their respective size limit do not change their position on the surface of a component or assembly even under the influence of extreme impacts. In view of the fact that the acceleration of impacts that occur in "day to day" situations amounts to less than 100 g, a tin particle with a diameter of less than 905 µm will not change its position.

The simplified evaluation based on the above takes into consideration neither the surface roughness of the particles nor that of the underground surface. It simplifies the powder particles geometrically to a ball shape, it does not consider double contacts of the particles, for example, with structures such as corners, and it ignores the capillary forces that arise under humidity, as well as agglomerates, that is, an amassing of particles. Nevertheless, the evaluation demonstrates that smaller particles remain adhered in the event of shocks and impacts, whereas larger particles may change their position, meaning they are mobile. In addition to this the evaluation shows that the detachment of particles upon impact also depends on the particle material itself.

Figure 10:
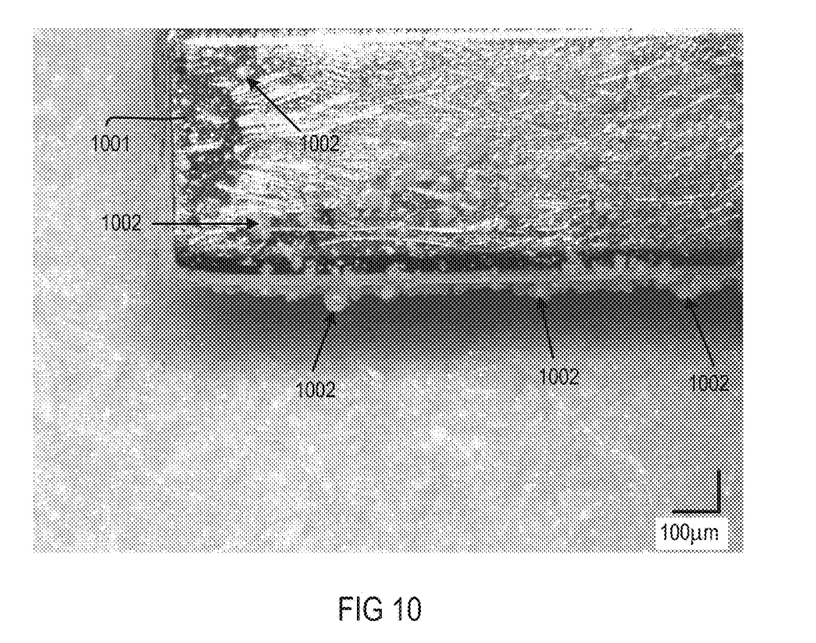
FIG. 10 is a microscopic photograph of an electrical contact of a component, covered with powder particles.

In view of the fact that an impact stress of 1500 g is already in itself a very high acceleration, it may be expected that particles under 1000 µm, for example, under 600 µm (500 µm) will probably rarely be shaken off. A particle's probability of changing its position as a result of impact rises exponentially with the size of the particle. Very small particles such as particles, for example, with a diameter of less than 50 µm, will, in all probability, no longer depart from the assembly without considerable additional stress, such as impact from other particles, wiping, blowing, brushing etc. These findings now make possible the long-lasting electrical isolation of a surface using isolating particles, provided these particles are present in sufficient quantity and do not exceed a given size. FIG. 10 is a microscopic photograph of an electrical connection 1001 of a component, not shown in detail, covered with powder particles 1002.

In addition to the combinations of specific features and measures shown in the example embodiments, any other combination of these and other features and measures is equally possible. The description of embodiments has been presented for purposes of illustration and description. Suitable modifications and variations to the embodiments may be performed in light of the above description or may be acquired from practicing the methods. For example, unless otherwise noted, one or more of the described methods may be performed by a suitable device and/or combination of devices. The described methods and associated actions may also be performed in various orders in addition to the order described in this application, in parallel, and/or simultaneously. The described assemblies are exemplary in nature, and may include additional elements and/or omit elements.

As used in this application, an element or step recited in the singular and proceeded with the word "a" or "an" should be understood as not excluding plural of said elements or steps, unless such exclusion is stated. Furthermore, references to "one embodiment" or "one example" of the present disclosure are not intended to be interpreted as excluding the existence of additional embodiments that also incorporate the recited features. The terms "first," "second," and "third," etc. are used merely as labels, and are not intended to impose numerical requirements or a particular positional order on their objects.

While various embodiments of the invention have been described, it will be apparent to those of ordinary skilled in the art that many more embodiments and implementations are possible within the scope of the invention. In particular, the skilled person will recognize the interchangeability of various features from different embodiments. Although these techniques and systems have been disclosed in the context of certain embodiments and examples, it will be understood that these techniques and systems may be extended beyond the specifically disclosed embodiments to other embodiments and/or uses and obvious modifications thereof.

The invention claimed is:

1. An electrical or electronic assembly comprising a carrier and one or more electrical or electronic components that are mechanically and electrically connected with the carrier, wherein the carrier or at least one of the components or both is entirely or partially coated with a powder and wherein the powder comprises powder particles of electrically isolating material that have an average particle diameter of less than 1000 micrometers, and the particles are adhered to the carrier or at least one of the components or both the carrier and the at least one of the components by surface and field forces.

2. The assembly of claim 1, wherein the electrically isolating material has a solubility in water of less than 0.1 grams per liter.

3. The assembly of claim 1, wherein the electrically isolating material is resistant to temperatures of at least 200 degrees Celsius.

4. The assembly of claim 1, wherein the electrically isolating material comprises a non-organic material.

5. The assembly of claim 4, wherein the non-organic material comprises ceramic material.

6. The assembly in accordance with claim 5, wherein the ceramic material comprises at least one of the following compounds: calcium carbonate, silicon dioxide, magnesium oxide and aluminum oxide.

7. The assembly of claim 1, wherein the electrically isolating material comprises organic material.

8. The assembly of claim 7, wherein the organic material comprises a plastic from at least one of the following materials: thermoplastic and thermoset.

9. The assembly of claim 8, wherein the plastic comprises at least one of the following technical plastics: polyamide, polycarbonate, polyvinyl chloride, polymethyl methacrylate, acrylonitrile butadiene styrene copolymer, polybutylene terephthalate, polyethylene, polypropylene, polystyrene, styrene acrylonitrile copolymer, polyethylene terephthalate, polytetrafluorethylene, polyoxymethelene, polyvinylidene fluorid, perfluoralkoxy polymer, fluorethylene propylene, tetrafluoroethylene perfluor methyl vinyl ether, ethylene chlorotrifluoro ethylene, polyether ether ketone, polyetherimide, polyether sulfone, polysulfone and polyphenylene sulfide.

10. The assembly of claim 1, wherein the average particle diameter is less than 600 micrometers.

11. The assembly of claim 10, wherein the average particle diameter is less than 100 micrometers.

12. A method for electrically isolating an electrical or electronic assembly having a carrier and one or more electrical or electronic components mechanically and electrically connected with the carrier, the method comprising: coating the carrier or at least one of the components or both entirely or partially with powder, the powder comprising powder particles of electrically isolating material that have an average particle diameter of less than 1000 micrometers, and wherein the particles are adhered to the carrier or at least one of the components or both the carrier and the at least one of the components by surface and field forces.

13. The method of claim 12, wherein coating comprises: spraying the powder out of a nozzle onto the carrier or onto at least one of the components, or both, so that at least a portion of the powder comes to rest on the carrier or at least one of the components, or both, and entirely or partially covers these with powder.

14. The method of claim 12, wherein coating comprises:
locally limited or complete electrostatic loading of the carrier or at least one of the components, or both; and
releasing of the powder into the area surrounding the assembly to induce the attraction of the powder particles, thus entirely or partially covering the carrier or at least one of the components or both.

15. The method of claim 12, wherein coating comprises:
completely covering the carrier or at least one of the components, or both, with the powder; and
shaking or blowing off the powder so that a portion of the powder is removed and the another portion remains covering the carrier or at least one of the components, or both, due to surface forces.

16. The method of claim 12, wherein coating comprises:
placing a container with the powder in an original position on the assembly so that, initially, no powder falls onto the carrier and the components;
starting from the original position, rotating the container so that at least a portion of the powder comes into contact with the carrier or with at least one of the components, or both; and
returning the container to its original position so that a portion of the powder is removed from the carrier or from at least one of the components, or both, and another portion of the powder remains covering the carrier or at least one of the components, or both, due to surface forces.

* * * * *